United States Patent
Zimmer

(10) Patent No.: US 10,533,877 B2
(45) Date of Patent: Jan. 14, 2020

(54) ANGLE SENSOR WITH DISTURBANCE FIELD SUPPRESSION

(71) Applicant: Infineon Technologies AG, Neubiberg (DE)

(72) Inventor: Jürgen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 384 days.

(21) Appl. No.: 15/435,972

(22) Filed: Feb. 17, 2017

(65) Prior Publication Data

US 2018/0238711 A1    Aug. 23, 2018

(51) Int. Cl.
G01D 5/14    (2006.01)

(52) U.S. Cl.
CPC .................... G01D 5/145 (2013.01)

(58) Field of Classification Search
CPC . G01D 5/12; G01D 5/14; G01D 5/145; G01B 7/30; G01R 33/02; G01R 33/022; G01R 15/20
See application file for complete search history.

(56) References Cited

U.S. PATENT DOCUMENTS

| 6,791,219 B1* | 9/2004 | Eric ........................ H02K 29/08 310/68 B |
| 2009/0206827 A1* | 8/2009 | Aimuta .................. G01D 5/145 324/207.25 |
| 2009/0315547 A1* | 12/2009 | Abwa ..................... G01R 33/02 324/244 |
| 2014/0285188 A1* | 9/2014 | Kuwano ................ G01R 33/09 324/252 |
| 2015/0019152 A1* | 1/2015 | Scheibenzuber .... G01D 5/2448 702/94 |
| 2015/0137797 A1 | 5/2015 | Ausserlechner et al. |
| 2015/0185297 A1 | 7/2015 | Zimmer et al. |
| 2016/0169707 A1* | 6/2016 | Hirota .................... G01R 33/09 702/151 |

FOREIGN PATENT DOCUMENTS

| CN | 101377401 A | 3/2009 |
| CN | 101918796 A | 12/2010 |
| CN | 202216701 U | 5/2012 |
| CN | 101918797 B | 4/2014 |
| JP | 2012088182 A | 5/2012 |

* cited by examiner

*Primary Examiner* — Son T Le
(74) *Attorney, Agent, or Firm* — Harrity & Harrity, LLP

(57) ABSTRACT

An angle sensor may include a first sensing element to provide a first set of output signals associated with a magnetic field produced by a rotatable magnet. The first sensing element may be arranged at a first distance from a surface of the rotatable magnet along a given direction, and may be configured to operate in a non-saturated mode. The angle sensor may include a second sensing element to provide a second set of output signals associated with the magnetic field produced by the rotatable magnet. The second sensing element may be arranged at a second distance from the surface of the rotatable magnet along the given direction, and may be configured to operate in a non-saturated mode.

20 Claims, 12 Drawing Sheets

ANGLE SENSOR WITH DISTURBANCE FIELD SUPPRESSION

BACKGROUND

A magnetic angle sensor may be used to determine an orientation of a magnetic field (e.g., an angle between zero degrees and three hundred and sixty degrees) produced by a magnet. The magnetic angle sensor may be a Hall-effect sensor, a magnetoresistive (MR)-based sensor, a variable reluctance sensor (VRS), a fluxgate sensor, or the like.

SUMMARY

According to some possible implementations, an angle sensor may include: a first sensing element to provide a first set of output signals associated with a magnetic field produced by a rotatable magnet, wherein the first sensing element may be arranged at a first distance from a surface of the rotatable magnet along a given direction, and wherein the first sensing element may be configured to operate in a non-saturated mode; and a second sensing element to provide a second set of output signals associated with the magnetic field produced by the rotatable magnet, wherein the second sensing element may be arranged at a second distance from the surface of the rotatable magnet along the given direction, and wherein the second sensing element may be configured to operate in a non-saturated mode.

According to some possible implementations, an apparatus may include: a first sensing element, arranged at a first distance from a magnet, to provide a first set of output signals associated with a magnetic field produced by the magnet, wherein amplitudes of the first set of output signals may be dependent on a strength of the magnetic field at the first sensing element; and a second sensing element, arranged at a second distance from the magnet, to provide a second set of output signals associated with the magnetic field produced by the magnet, wherein amplitudes of the second set of output signals may be dependent on a strength of the magnetic field at the second sensing element.

According to some possible implementations, a magnetic sensor may include: a first sensing element to provide a first set of output signals associated with a magnetic field produced by a magnet, wherein the first sensing element may be arranged at a first distance from the magnet, and wherein the first sensing element may operate in a non-saturated mode such that amplitudes of the first set of output signals depends on a strength of the magnetic field at the first sensing element; and a second sensing element to provide a second set of output signals associated with the magnetic field produced by the magnet, wherein the second sensing element may be arranged at a second distance from the magnet, and wherein the second sensing element may operate in a non-saturated mode such that amplitudes of the second set of output signals depends on a strength of the magnetic field at the second sensing element.

According to some possible implementations, a method may include providing, by a first sensing element, a first set of output signals associated with a strength of a magnetic field at the first sensing element, wherein the first sensing element may be arranged at a first distance from a magnet associated with the magnetic field, and wherein the first sensing element may be configured to operate in a non-saturated mode such that amplitudes of the first set of output signals are dependent on the strength of the magnetic field at the first sensing element; providing, by a second sensing element, a second set of output signals associated with a second strength of the magnetic field at the second sensing element, wherein the second sensing element may be arranged at a second distance from the magnet associated with the magnetic field, and wherein the second sensing element is configured to operate in a non-saturated mode such that amplitudes of the second set of output signals are dependent on the second strength of the magnetic field at the second sensing element. In some implementations, the method may further include determining, by a processor, an angle of rotation of the magnet, associated with the magnetic field, based on the first set of output signals and the second set of output signals. In some implementations, the determined angle of rotation may be free from an influence of a disturbance magnetic field that is present at the first sensing element and the second sensing element. In some implementations, the first sensing element and the second sensing element may be centered substantially on an axis of rotation of the magnet. In some implementations, the first sensing element and the second sensing element may be in a stacked arrangement in a single package.

DETAILED DESCRIPTION

Figure 1:
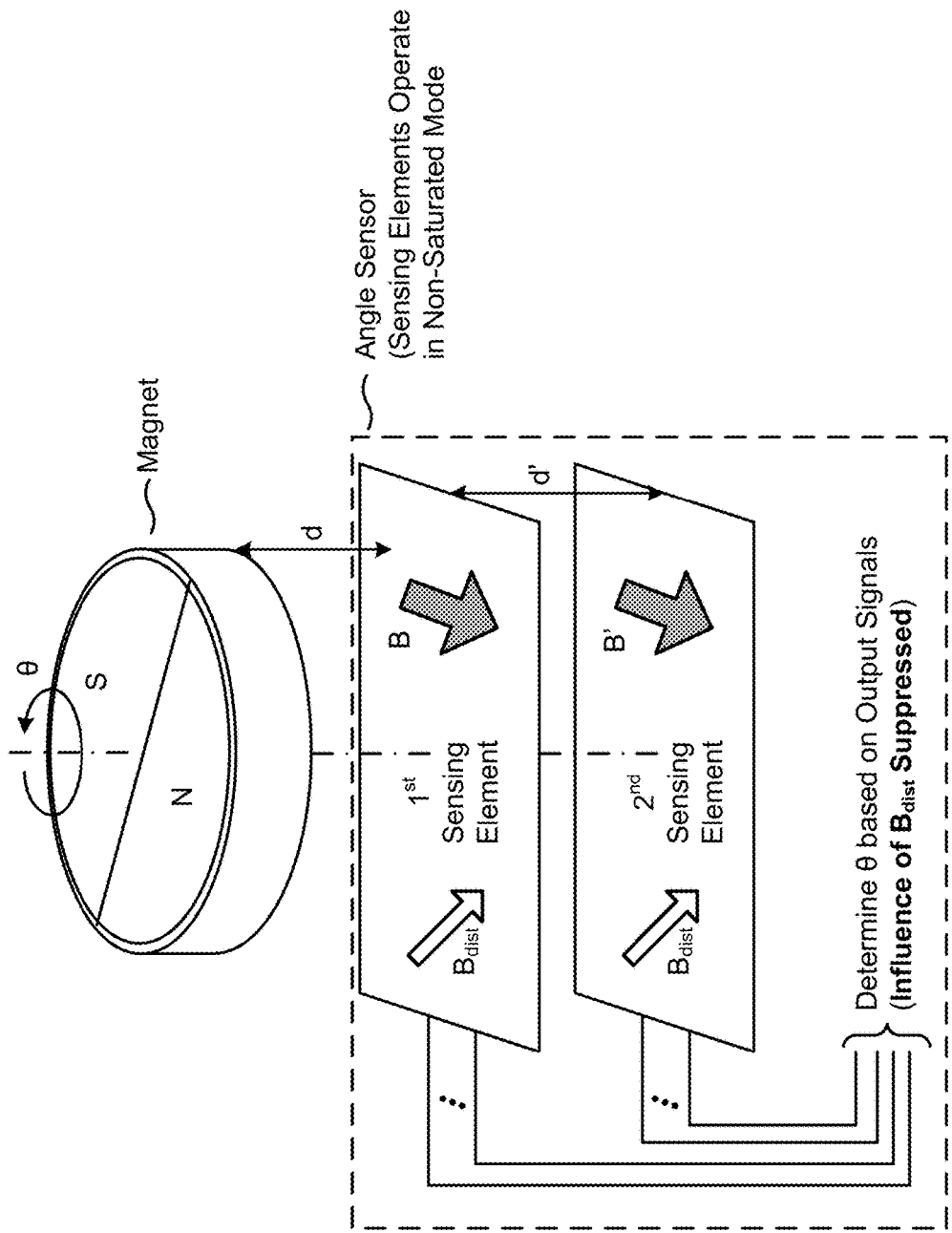
FIG. 1 is a diagram of an overview of an example implementation described herein.

The following detailed description of example implementations refers to the accompanying drawings. The same reference numbers in different drawings may identify the same or similar elements.

An angle sensor, such as an MR-based angle sensor or a Hall-effect sensor, may include a sensing element that is sensitive to in-plane magnetic fields (i.e., components of magnetic fields that are parallel to a surface of the sensing element). In some cases, such sensing elements may be designed to operate in a saturated mode (i.e., such that a strength of a magnetic field allows a free layer of the sensing element to overcome material inherent and/or geometry originated magnetic anisotropies in order to improve accuracy).

However, when a disturbance magnetic field with components in the sensitive plane of the sensor (e.g., a magnetic field other than a rotating magnetic field produced by a magnet associated with the angle sensor) is present, magnetization of the sensing element aligns along a vector sum of the disturbance magnetic field and the rotating magnetic field. Thus, accuracy of an angle measured by the angle sensor may be reduced due to the influence of the disturbance magnetic field. In such a case, the influence of the disturbance magnetic field on the measured angled is dependent on an orientation of the rotating magnetic field (i.e., the influence of the disturbance magnetic field changes as the magnet rotates, thus variably increasing or decreasing the measured angle as the magnet rotates). Moreover, when the sensing elements of the angle sensor are designed to operate in the saturated mode, information regarding strengths of the in-plane components of the effective magnetic field is not available, which prevents the influence of the disturbance field from being identified.

As an example, a disturbance magnetic field with a strength of approximately 1.5 millitesla (mT), when combined with a rotating magnetic field with a strength of approximately 25 mT, may cause a deviation (e.g., an increase or a decrease) of up to approximately ±3.4° in the angle measured by the angle sensor. In some cases, the disturbance magnetic field may have a strength of approximately 1.5 mT (or more) while the rotating magnetic field may have a strength in a range from approximately 20 mT to approximately 70 mT.

One technique for suppressing influence of a disturbance magnetic field suppression is to use an out-of-axis arrangement of sensing elements (i.e., such that sensing elements are not centered on an axis of rotation of the magnet), which allows for the influence of the disturbance magnetic field to be suppressed. However, such a technique may require complex positioning of sensing elements, which may increase an overall size of the angle sensor and/or increase a cost to manufacture and/or assemble the angle sensor.

Another technique for suppressing an influence of a disturbance magnetic field is to implement a gradiometer arrangement where a differential magnetic field is provided for use in measuring the rotation angle. However, such a technique may have high sensitivity to positioning of one or more elements of the angle sensor, which may reduce accuracy and/or increase cost of the angle sensor.

An additional technique for suppressing an influence of a disturbance magnetic field may be to detect an in-plane component of the disturbance magnetic field, and compensate for the in-plane component. Such an implementation may be achieved using an MR-based angle sensor that operates in a non-saturated mode. However, in order to achieve suppression of the disturbance magnetic field using such a technique, the disturbance magnetic field must be substantially constant (or vary slowly over a relatively long period of time), which may not be the case in some angle sensor applications.

Implementations described herein provide an angle sensor, including at least two sensing elements, that is capable of suppressing an influence of a disturbance magnetic field on an angular measurement associated with a rotating magnetic field (e.g., produced by a rotatable magnet). In some implementations, the at least two sensing elements are capable of measuring strengths of corresponding in-plane components of a magnetic field (i.e., the sets of sensing elements may operate in a non-saturated mode) in order to permit suppression of the influence of the disturbance magnetic field.

In some implementations, suppression of the disturbance magnetic field may be achieved by arranging the at least two sensing elements at different distances from the magnet, thereby exposing the at least two sensing elements to different magnetic field strengths. Here, differences in output signals, provided by the sensing elements, may be calculated, and the angle of rotation may be determined based on these differences. Determination of the angle of rotation in this manner suppresses (i.e., cancels) the influence of the disturbance magnetic field from the measured angle, thereby improving accuracy of the angle sensor. In some implementations, the sensing elements may be centered substantially on an axis of rotation of the magnet, which reduces costs of manufacturing and/or assembly relative to having sensing elements that are not centered on the axis of rotation.

Additionally, since the angle sensor includes at least two sensing elements, redundancy in an angle measurement capability is achieved with a sufficient angle accuracy (e.g., in a case where a sensing element fails or experiences an error, another sensing element may still provide an angle measurement), thereby improving safety and/or reliability of the angle sensor. Additional details regarding operation of the angle sensor are described below.

FIG. 1 is a diagram of an overview of an example implementation 100 described herein. As shown in FIG. 1, a magnet (e.g., mechanically connected to a rotatable object) may rotate about an axis (e.g., an axis through a center of the magnet) and produce a rotating magnetic field. As shown, an angle sensor, associated with measuring an angle of rotation (θ) of the magnet, may include a first sensing element (identified as $1^{st}$ sensing element in FIG. 1) and a second sensing element (identified as $2^{nd}$ sensing element in FIG. 1).

As shown, the first sensing element may be arranged substantially on a plane at a first distance (d) from a surface of the magnet such that a first in-plane component of the rotating magnetic field (B) is present at the first sensing element. In some implementations, the first sensing element may be substantially centered on the axis of rotation of the magnet. As further shown, an in-plane component of a disturbance magnetic field ($B_{dist}$) is also present at the first sensing element. As shown, the first sensing element may output a first set of output signals, the amplitudes of which depend on a strength of B and a strength of $B_{dist}$ (i.e., the first sensing element may operate in a non-saturated mode).

As further shown, the second sensing element may be arranged substantially on a plane at a second distance (d+d') from the surface of the magnet such that a second in-plane component of the rotating magnetic field (B') is present at the second sensing element. Here, a strength of B' is less than the strength of B since the distance d+d' is greater than the distance d. In some implementations, the second sensing element may be substantially centered on the axis of rotation of the magnet. As further shown, $B_{dist}$ is also present at the second sensing element. As shown, the second sensing element may output a second set of output signals, the amplitudes of which depend on the strength of B' and the strength of $B_{dist}$ (i.e., the second sensing element may operate in a non-saturated mode).

As further shown, the angle sensor may determine the angle θ based on the first set of output signals and the second set of output signals. For example, the angle sensor may calculate differences in amplitude between the first set of output signals and corresponding output signals in the second set of output signals, and determine the angle θ based on these. Determination of the angle θ in this manner may suppress, eliminate, and/or cancel the influence of $B_{dist}$ from the angular measurement, thereby improving accuracy of the angle sensor.

As indicated above, FIG. 1 is provided merely as an example. Other examples are possible and may differ from what was described with regard to FIG. 1.

Figure 2:
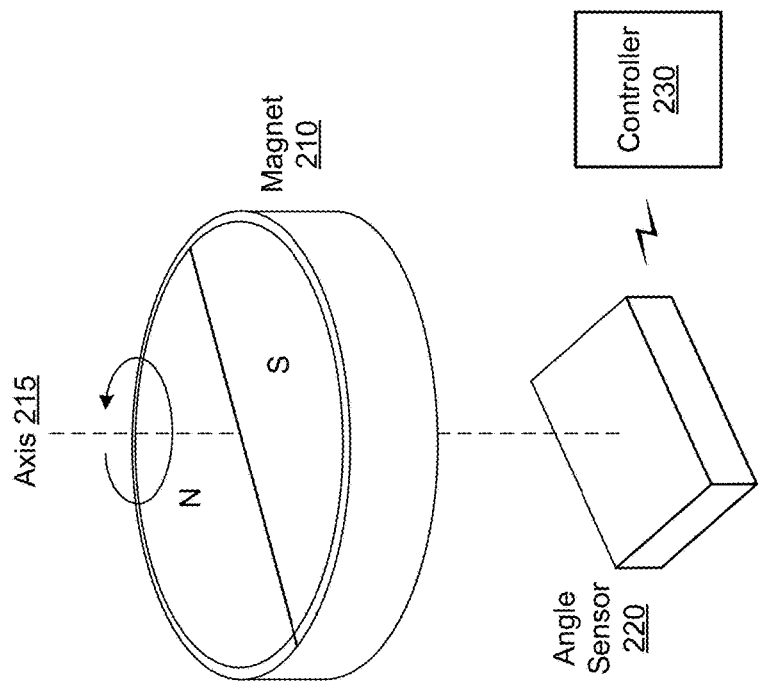
FIG. 2 is a diagram of an example environment in which systems and/or methods, described herein, may be implemented.

FIG. 2 is a diagram of an example environment 200 in which apparatuses described herein may be implemented. As shown in FIG. 2, environment 200 may include a magnet 210 that may rotate about an axis 215, an angle sensor 220, and a controller 230.

Magnet 210 may include one or more magnets positioned to rotate about axis 215 (e.g., an imaginary line). In some implementations, magnet 210 may be connected (e.g., mechanically) to a rotatable object (not shown) such that a rotation angle of magnet 210 corresponds to a rotation angle of the rotatable object (e.g., when there exists a non-slip relation between an end face of the rotatable object and magnet 210).

In the example environment 200 shown in FIG. 2, magnet 210 comprises a first half forming a north pole (N) and a second half forming a south pole (S), so that magnet 210 comprises one pole pair. In some implementations, magnet 210 may, without limitation, comprise more than one pole pair. In some implementations, magnet 210 may include a disk magnet that is positioned concentrically about axis 215 that passes through the center of magnet 210, as shown in FIG. 2. While magnet 210 is shown as circular in FIG. 2, magnet 210 may be another shape, such as a square, a rectangular, an ellipse, or the like. For example, magnet 210 may be of an elliptical shape in an instance where an angle between a plane corresponding to a surface of magnet 210 and axis 215 deviates from a substantially perpendicular relation. The plane may include a plane symmetrically cutting through magnet 210 and including a magnet center of magnet 210. In most practical cases, the plane may be substantially perpendicular to axis 215. As another example, magnet 210 may include a ring magnet that is positioned to rotate about axis 215 (along with the rotatable object). A ring magnet may be of interest for an arrangement of magnet 210 at an end of the rotatable object.

In some implementations, magnet 210 may include two alternating poles on at least two portions of magnet 210. For example, magnet 210 may include a diametrically magnetized magnet with a north pole on a first half of magnet 210 and a south pole on a second half of magnet 210, as shown in FIG. 2A. As another example, magnet 210 may include an axially magnetized magnet with a first north pole and a first south pole stacked on a first half of magnet 210, and a second south pole and a second north pole stacked on a second half of magnet 210 (not shown).

Additionally, or alternatively, magnet 210 may include a dipole magnet (e.g., a dipole bar magnet, a circular dipole magnet, an elliptical dipole magnet, etc.), a permanent magnet, an electromagnet, a magnetic tape, or the like. Magnet 210 may be comprised of a ferromagnetic material (e.g., Hard Ferrite), and may produce a magnetic field. Magnet 210 may further comprise a rare earth magnet which may be of advantage due to an intrinsically high magnetic field strength of rare earth magnets. As described above, in some implementations, magnet 210 may be attached to or coupled with a rotatable object for which a rotation angle may be determined (e.g., by angle sensor 220, by controller 230) based on a rotation angle of magnet 210.

Angle sensor 220 may include one or more apparatuses for sensing components of a magnetic field for use in determining an angle of rotation (e.g., of magnet 210, of a rotatable object to which magnet 210 is connected, etc.). For example, angle sensor 220 may include one or more circuits (e.g., one or more integrated circuits). In some implementations, angle sensor 220 may be placed at a position relative to magnet 210 such that angle sensor 220 may detect components of the magnetic field produced by magnet 210. In some implementations, angle sensor 220 may include an integrated circuit that includes an integrated controller 230 (e.g., such that an output of angle sensor 220 may include information that describes a rotation angle of magnet 210 and/or the rotatable object).

In some implementations, angle sensor 220 may include a group of sensing elements configured to sense components of the magnetic field, produced by magnet 210, that are present at angle sensor 220. For example, angle sensor 220 may include a first sensing element (e.g., arranged substantially on a first plane proximal to magnet 210) associated with determining the rotation angle and a second sensing element (e.g., arranged substantially on a second plane distal to magnet 210) associated with determining the rotation angle. In some implementations, angle sensor 220 is capable of operating in a non-saturated mode (i.e., output signals associated with sensing elements of angle sensor 220 are dependent on a strength of the magnetic field). Additional details regarding angle sensor 220 are described below with regard to FIG. 3.

Controller 230 may include one or more circuits associated with determining a rotation angle of magnet 210, and providing information associated with the rotation angle of magnet 210 and hence the rotation angle of the rotatable object to which magnet 210 is connected. For example, controller 230 may include one or more circuits (e.g., an integrated circuit, a control circuit, a feedback circuit, etc.). Controller 230 may receive input signals from one or more sensors, such as one or more angle sensors 220, may process the input signals (e.g., using an analog signal processor, a digital signal processor, etc.) to generate an output signal, and may provide the output signal to one or more other devices or systems. For example, controller 230 may receive one or more input signals from angle sensor 220, and may use the one or more input signals to generate an output signal comprising the angular position of magnet 210 and/or the rotatable object to which magnet 210 is connected.

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
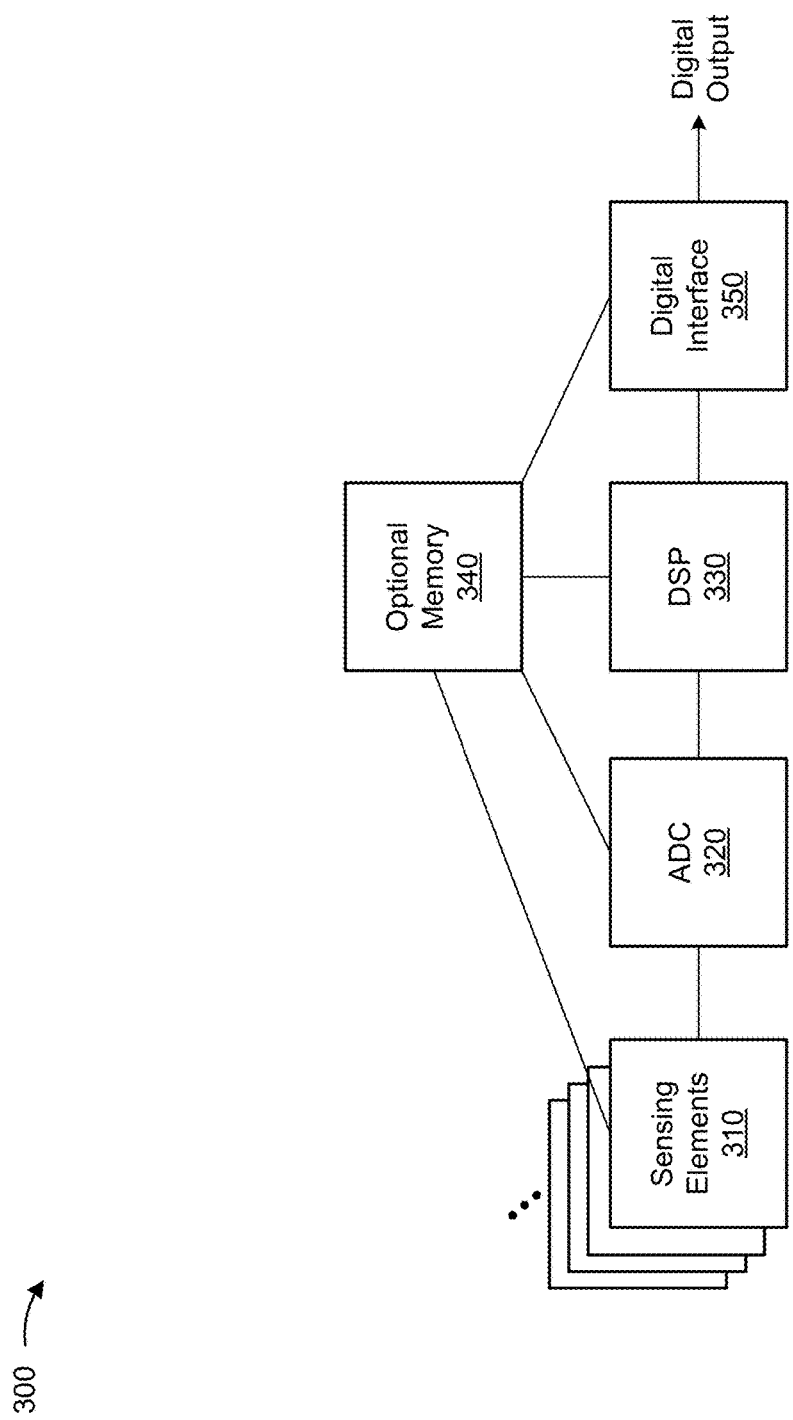
FIG. 3 is a diagram of example elements of an angle sensor included in the example environment of FIG. 2.

FIG. 3 is a diagram of example elements of angle sensor 220 included in example environment 200 of FIG. 2. As shown, angle sensor 220 may include a group of sensing elements 310, an analog-to-digital convertor (ADC) 320, a digital signal processor (DSP) 330, an optional memory element 340, and a digital interface 350.

Sensing element 310 may include an element for sensing a component of a magnetic field present at angle sensor 220 (e.g., the magnetic field generated by magnet 210). For example, sensing element 310 may include a MR-based sensing element, elements of which are comprised of a magnetoresistive material (e.g., nickel-iron (NiFe)), where the electrical resistance of the magnetoresistive material may depend on a strength and/or a direction of the magnetic field present at the magnetoresistive material. Here, sensing element 310 may operate based on an anisotropic magnetoresistance (AMR) effect, a giant magnetoresistance (GMR) effect, a tunnel magnetoresistance (TMR) effect, or the like. As another example, sensing element 310 may include a Hall-based sensing element that operates based on a Hall-effect. As an additional example, sensing element 310 may include a variable reluctance (VR) based sensing element that operates based on induction. In some implementations, sensing element 310 operates in a non-saturated mode (i.e., such that an amplitude of an output signal provided by sensing element 310 is dependent on a strength of the magnetic field at sensing element 310). Additional details regarding sensing elements 310 are described below with regard to FIG. 4.

ADC 320 may include an analog-to-digital converter that converts an analog signal from the one or more sensing elements 310 to a digital signal. For example, ADC 320 may convert analog signals, received from the one or more sensing elements 310, into digital signals to be processed by DSP 330. ADC 320 may provide the digital signals to DSP 330. In some implementations, angle sensor 220 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for controller 230 as shown in FIG. 2), such as output signals associated with determining the rotation angle of magnet 210 rotating with a rotatable object.

Optional memory element 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by angle sensor 220. In some implementations, optional memory element 340 may store information associated with processing performed by DSP 330. Additionally, or alternatively, optional memory element 340 may store configurational values or parameters for sensing elements 310 and/or information for one or more other elements of angle sensor 220, such as ADC 320 or digital interface 350.

Digital interface 350 may include an interface via which angle sensor 220 may receive and/or provide information from and/or to another device, such as controller 230 (see FIG. 2). For example, digital interface 350 may provide the output signal, determined by DSP 330, to controller 230 and may further receive information from the controller 230.

The number and arrangement of elements shown in FIG. 3 are provided as an example. In practice, angle sensor 220 may include additional elements, fewer elements, different elements, or differently arranged elements than those shown in FIG. 3. Additionally, or alternatively, a set of elements (e.g., one or more elements) of angle sensor 220 may perform one or more functions described as being performed by another set of elements of angle sensor 220.

Figure 4:
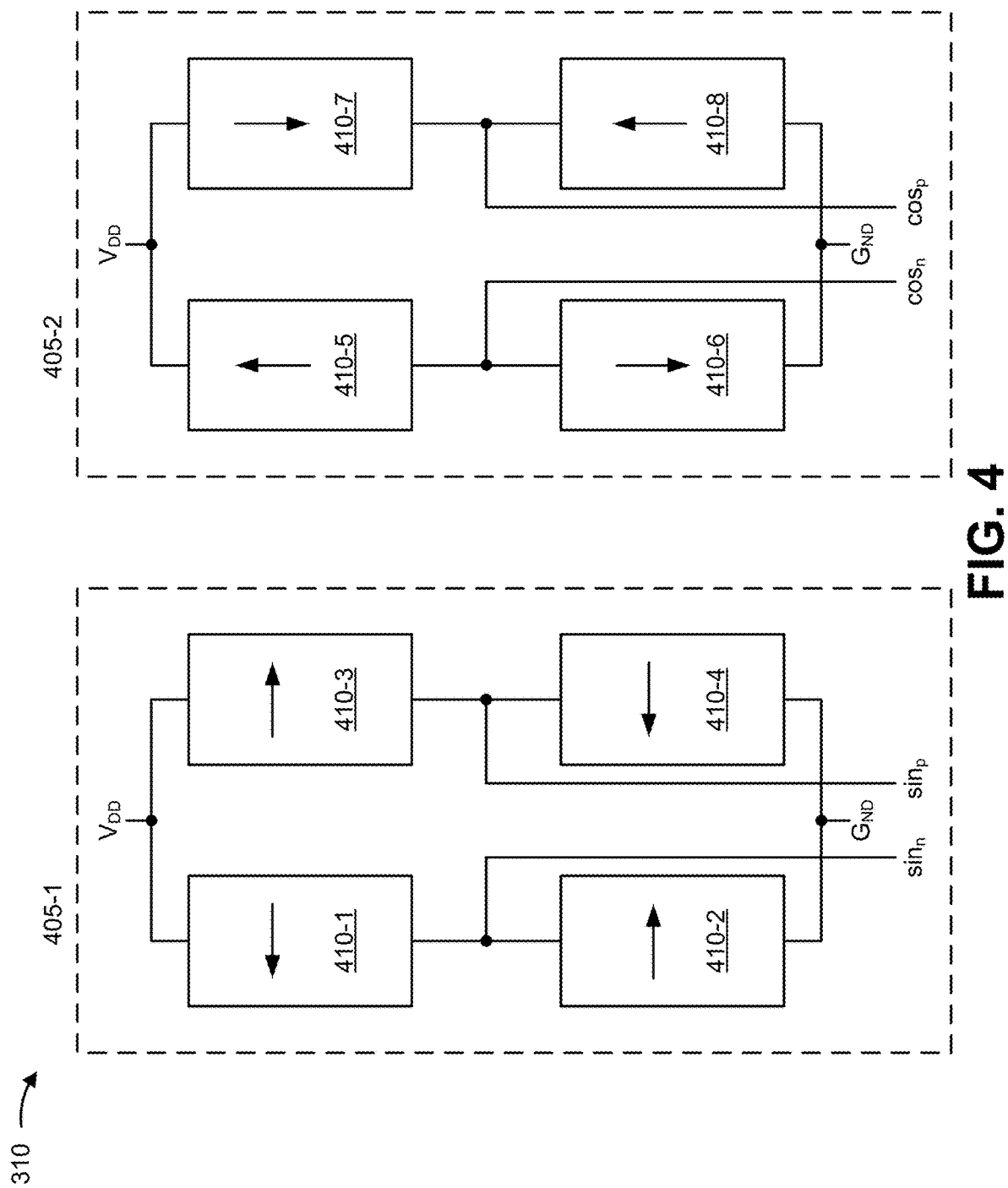
FIG. 4 is a diagram of an example implementation of a sensing element that may be included in the angle sensor of FIG. 2.

FIG. 4 is a diagram of an example implementation of a sensing element 310 that may be included in angle sensor 220 of FIG. 2. As shown in FIG. 4, in some implementations, sensing element 310 may include a bridge 405-1, including resistors 410-1 through 410-4, and a bridge 405-2 including resistors 410-5 through 410-8.

Bridge 405 (e.g., bridges 405-1, bridge 405-2) include one or more circuits that provide one or more output signals based on a direction (e.g., an angle) and a strength of a magnetic field applied to bridge 405. For example, as shown in FIG. 4, bridge 405 may include a full Wheatstone bridge. Additionally, or alternatively, bridge 405 may include a half Wheatstone bridge, a quarter Wheatstone bridge, or the like. As shown, each bridge 405 may be coupled to a power supply in order to receive an input voltage signal (shown as VDD). As further shown, each bridge 405 may further be coupled to a ground (shown as GND).

As further shown, bridge 405, when implemented as a full bridge, may include four resistors 410. Resistor 410 may include a resistor, such as an MR-based resistor, with an electrical resistance that depends on an angle and a strength of an in-plane component of a magnetic field applied to resistor 410. The angle of the magnetic field may form an angle with respect to a magnetic reference direction associated with resistor 410. As described in further detail below, output signals (e.g., voltages) from bridge 405, which vary based on resistances of resistors 410, may be used to calculate the angle of rotation of magnet 210 with suppression of an influence of a disturbance magnetic field.

In some implementations, magnetic reference directions of resistors 410 included in bridge 405 may be aligned such that bridge 405 provides a set of output signals corresponding to a particular in-plane component of the magnetic field present at sensing element 310. The reference direction of a resistor determines the phase of the output signal with respect to an external rotating magnetic field. For example, as shown in FIG. 4, magnetic reference directions of resistors 410-1 through 410-4 may be aligned such that bridge 405-1 provides a first set of output signals corresponding to sine component of the in-plane magnetic field present at sensing element 310. Here, the first set of output signals may include a sine signal ($\sin_p$) and an inverted sine signal ($\sin_n$). As another example, as further shown in FIG. 4, magnetic reference directions of resistors 410-5 through 410-8 may be aligned such that bridge 405-2 provides a second set of output signals corresponding to cosine component of the in-plane magnetic field (i.e., a component orthogonal to the first component) present at sensing element 310. Here, the second set of output signals may include a cosine signal ($\cos_p$) and an inverted cosine signal ($\cos_n$).

As described above, angle sensor 220 may include two or more sensing elements 310, where each sensing element is arranged at a different distance from magnet 210. For example, in a case where angle sensor includes a pair of sensing elements 310: a first sensing element 310 (e.g., including a first pair of bridges 405) may be arranged at a first distance from a surface of magnet 210, and a second sensing element 310 (e.g., including a second pair of bridges 405) may be arranged at a second distance from the surface of magnet 210 (e.g., a larger distance than the first distance).

The number and arrangement of elements shown in FIG. 4 are provided as an example. In practice, sensing element 310 may include additional elements, fewer elements, different elements, or differently arranged elements than those shown in FIG. 4. For example, while FIG. 4 includes resistors 410 arranged to form a pair of full bridges, other arrangements are possible, such as an arrangement including a pair of half bridges, an arrangement including a full bridge and a half bridge, and/or the like. Additionally, or alternatively, a set of elements (e.g., one or more elements) of sensing element 310 may perform one or more functions described as being performed by another set of elements of sensing element 310.

Figure 5:
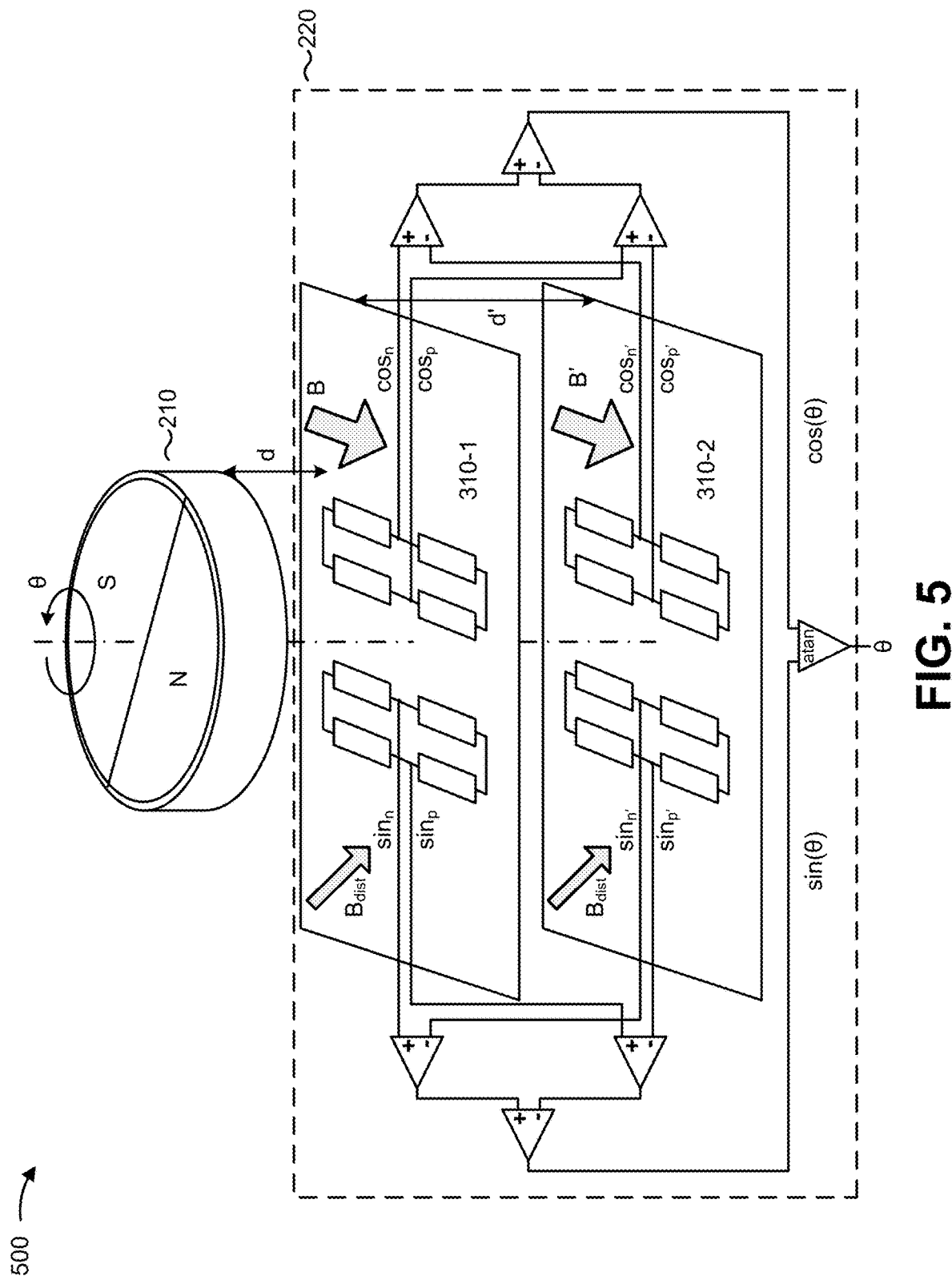
FIG. 5 is a diagram of an example implementation of an angle sensor capable of suppressing an effect of a disturbance magnetic field.

FIG. 5 is a diagram of an example implementation of angle sensor 220 capable of suppressing an effect of a disturbance magnetic field, as described herein. As shown in FIG. 5, magnet 210 (e.g., mechanically connected to a rotatable object) may rotate about an axis (e.g., an axis through a center of the magnet) and produce a rotating magnetic field. As shown, angle sensor 220, associated with measuring an angle of rotation (θ) of the magnet, may include a first sensing element 310 (identified as sensing element 310-1) and a second sensing element 310 (identified as sensing element 310-2).

As shown, sensing element 310-1 may be arranged substantially on a plane at a distance d from magnet 210 such that the in-plane component B of the rotating magnetic field is applied at sensing element 310-1. As shown, sensing element 310-1 may be substantially centered on the axis of rotation of magnet 210. As further shown, an in-plane component $B_{dist}$ of a disturbance magnetic field is also present at sensing element 310-1. As shown, sensing element 310-1 may provide a set of output signals, including $sin_p$, $sin_n$, $cos_n$, and $cos_p$, that depend on the angle θ, the strength of the in-plane component B, and the strength of the in-plane component $B_{dist}$.

As further shown, sensing element 310-2 may be arranged substantially on a plane at a distance d+d' from magnet 210 such that the in-plane component B' of the rotating magnetic field is applied at sensing element 310-2. Here, the strength of B' is weaker than that of B since sensing element 310-2 is further away from magnet 210 than sensing element 310-1. As shown, sensing element 310-2 may be substantially centered on the axis of rotation of magnet 210. As further shown, the in-plane component $B_{dist}$ of the disturbance magnetic field is also present at sensing element 310-2. As shown, sensing element 310-2 may provide a set of output signals, including $sin_{p'}$, $sin_{n'}$, $cos_{n'}$, and $cos_{p'}$, that depend on the angle θ, the strength of the in-plane component B', and the strength of the in-plane component $B_{dist}$.

As further shown, angle sensor 220 may determine the angle θ based on the output signals provided by sensing element 310-1 and sensing element 310-2. For example, the output signals provided by sensing element 310-1 and sensing element 310-2 may be represented as a function of the angle θ by the following formulae:

$$sin_p = B \times sin(\theta) + B_{dist} \sin \quad (1a)$$

$$sin_{p'} = B' \times sin(\theta) + B_{dist} \sin \quad (1b)$$

$$cos_p = B \times cos(\theta) + B_{dist} \cos \quad (1c)$$

$$cos_{p'} = B' \times cos(\theta) + B_{dist} \cos \quad (1d)$$

$$sin_n = -(B \times sin(\theta) + B_{dist} \sin) \quad (1e)$$

$$sin_{n'} = -(B' \times sin(\theta) + B_{dist} \sin) \quad (1f)$$

$$cos_n = -(B' \times cos(\theta) + B_{dist} \cos) \quad (1g)$$

$$cos_{n'} = -(B' \times cos(\theta) + B_{dist} \cos) \quad (1h)$$

where $B_{dist}$ sin and $B_{dist}$ cos represent the sine and cosine components of the in-plane component $B_{dist}$, respectively. Here, by determining the difference between corresponding output signals, the influence of the disturbance magnetic field $B_{dist}$ is cancelled:

$$sin_p - sin_{p'} = (B-B') \times sin(\theta) \quad (2a)$$

$$cos_p - cos_{p'} = (B-B') \times cos(\theta) \quad (2b)$$

$$sin_n - sin_{n'} = -(B-B') \times sin(\theta) \quad (2c)$$

$$cos_n - cos_{n'} = -(B-B') \times cos(\theta) \quad (2d)$$

In some implementations, angle sensor 220 may use signals resulting from evaluation of formulas 2a and 2b in order to obtain a disturbance-free signal for measurement of the angle θ. Here, angle sensor may determine an inverse tangent (arctan) of the signals resulting from formulas 2a and 2b, a result of which provides a measurement of the angle θ. Angle sensor 220 may similarly determine the angle θ using signals resulting from evaluation of formulas 2c and 2d.

Additionally, or alternatively, angle sensor 220 may use each of formulas 2a-2d in order to double a strength of the disturbance-free signals. For example, angle sensor 220 may evaluate the following formulas:

$$sin_p - sin_{p'} - (sin_n - sin_{n'}) = 2 \times (B-B') \times sin(\theta) \quad (3a)$$

$$cos_p - cos_{p'} - (cos_n - cos_{n'}) = 2 \times (B-B') \times cos(\theta) \quad (3b)$$

Here, angle sensor 220 may determine the inverse tangent of the signals resulting from formulas 3a and 3b, a result of which provides a measurement of the angle θ. Here, since the strength of the signals is doubled (as compared to the example described above), an accuracy of the measurement of the angle θ is improved.

In the above examples, amplitudes of the signals determined by angle sensor 220 depends on a difference in strength between B and B' at sensing element 310-1 and sensing element 310-2, respectively. In some implementations, this difference may be enhanced and/or increased by increasing distance d' between sensing element 310-1 and sensing element 310-2 (e.g., relative to distance d). Additionally, or alternatively, this difference may be enhanced and/or increased based on a magnetization of magnet 210 (e.g., diametral versus axial), as described below.

In this way, angle sensor 220 may determine the angle θ while suppressing, eliminating, and/or canceling the influence of $B_{dist}$ from the angular measurement, thereby improving accuracy of measurements provided by angle sensor 220.

The number and arrangement of elements shown in FIG. 5 are provided as an example. In practice, angle sensor 220 may include additional elements, fewer elements, different elements, or differently arranged elements than those shown in FIG. 5. Additionally, or alternatively, a set of elements (e.g., one or more elements) of angle sensor 220 may perform one or more functions described as being performed by another set of elements of angle sensor 220.

Figure 6:
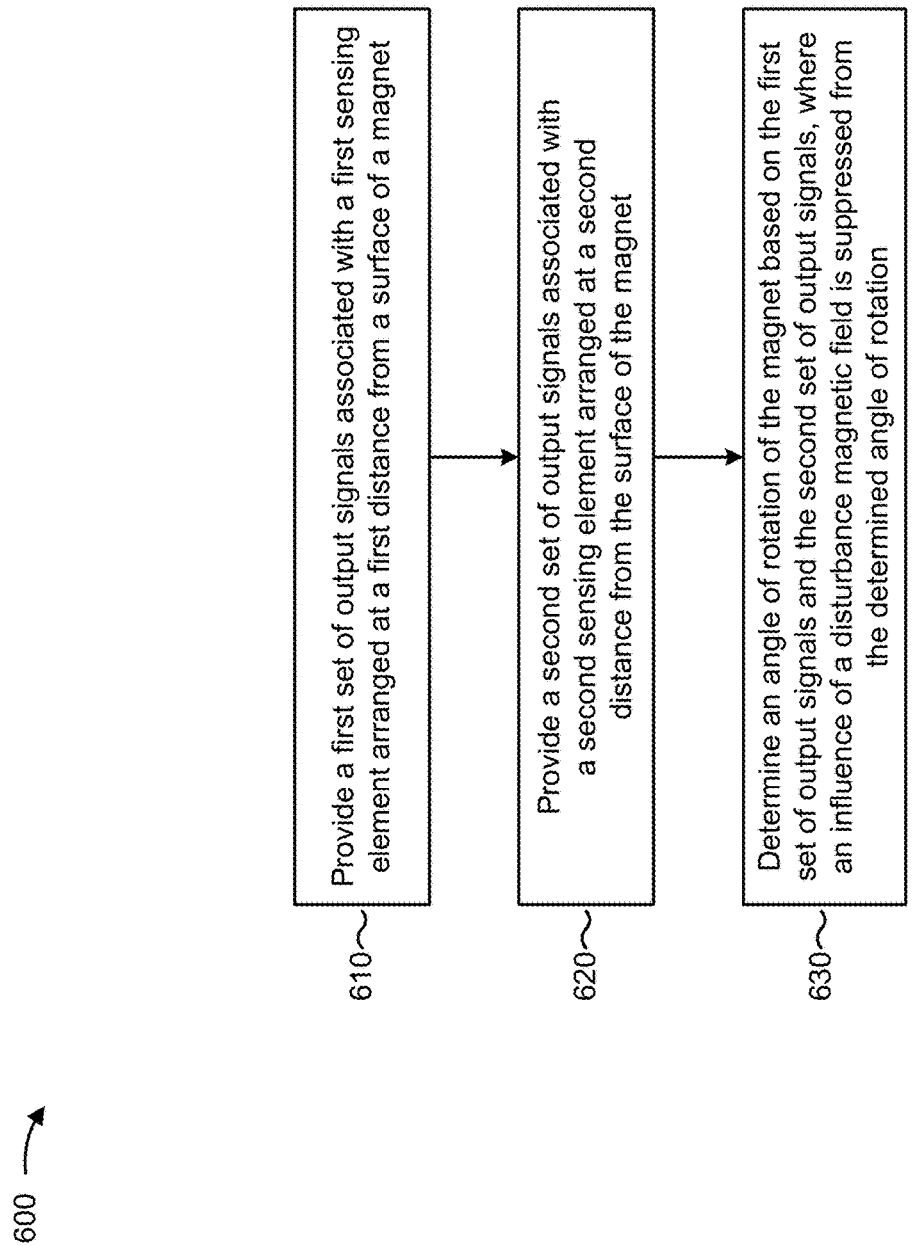
FIG. 6 is a flow chart of an example process for determining a rotation angle of a magnet while suppressing an effect of a disturbance magnetic field.

FIG. 6 is a flow chart of an example process 600 for determining a rotation angle of magnet 210 while suppressing an effect of a disturbance magnetic field. In some implementations, one or more process blocks of FIG. 6 may be performed by angle sensor 220. In some implementations, one or more process blocks of FIG. 6 may be performed by another device or a group of devices separate from or including angle sensor 220, such as controller 230.

As shown in FIG. 6, process 600 may include providing a first set of output signals associated with a first sensing element arranged at a first distance from a surface of a magnet (block 610). For example, sensing element 310-1 of angle sensor 220 may provide a first set of output signals, where sensing element 310-1 may be arranged at distance d from a surface of magnet 210, as described above. In some implementations, the distance d may be in a range from approximately 0.6 millimeters to approximately 10.0 millimeters.

As further shown in FIG. 6, process 600 may include providing a second set of output signals associated with a second sensing element arranged at a second distance from the surface of the magnet (block 620). For example, sensing element 310-2 of angle sensor 220 may provide a second set of output signals, where sensing element 310-2 may be arranged at distance d+d' from the surface of magnet 210, as described above.

As further shown in FIG. 6, process 600 may include determining an angle of rotation of the magnet based on the first set of output signals and the second set of output signals, where an influence of a disturbance magnetic field is suppressed from the determined angle of rotation (block 630). For example, angle sensor 220 (e.g., DSP 330) may determine the angle θ of magnet based on the first set of output signals and the second set of output signals, as described above. Here, an influence of a disturbance magnetic field may be suppressed from the determined angle θ, as described above.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7B:
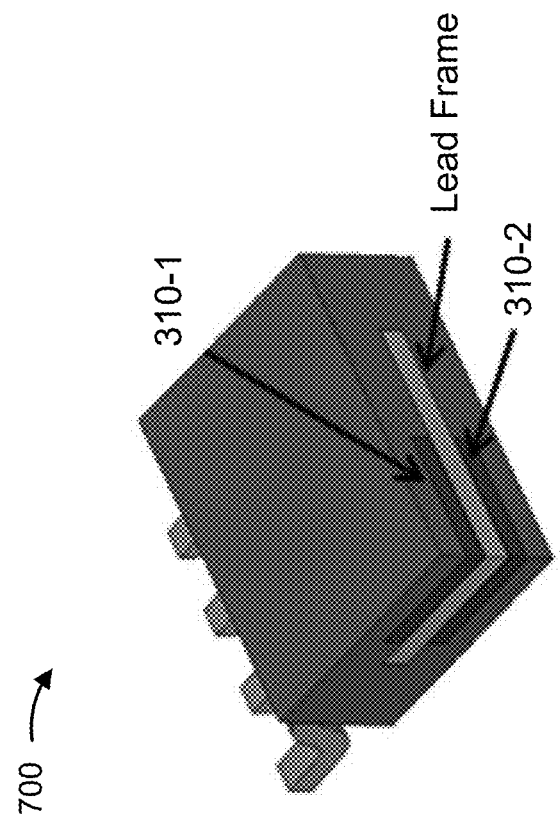
FIGS. 7A and 7B are views of an example package for an angle sensor that includes a stacked arrangement of sensing elements.
Figure 7A:
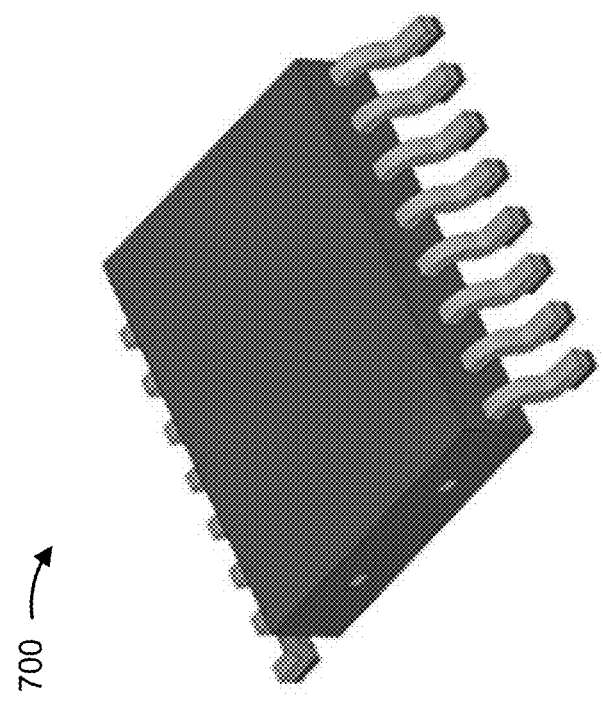

In some implementations, sensing elements 310-1 may be arranged in a stacked formation (e.g., as shown in FIG. 5). FIGS. 7A and 7B are views of an example package 700 for angle sensor 220 that includes a stacked arrangement of sensing elements 310. FIG. 7A is a view of an outside of package 700, while FIG. 7B is a cross-sectional view of package 700. As shown in FIG. 7B, package 700 may include sensing element 310-1 and sensing element 310-2 arranged in a stacked formation. As shown, sensing element 310-1 and sensing element 310-2 may be separated by a lead frame (e.g., an element inside package 700 to carry voltage signals). In some implementations, sensing elements 310 may be placed such that the respective active surfaces are adjacent to the lead frame.

For example, in FIG. 7B, the active surface of sensing element 310-1 may be arranged to face an upward direction, while the active surface of sensing element 310-2 may be arranged to face a downward direction. In some implementations, a thickness between the active surfaces of sensing element 310-1 and sensing element 310-2 may be approximately equal to twice a sum of thicknesses of a portion of a sensing element 310 chip covering the active surface, the lead frame, and a glue thickness. For example, in some implementations, the distance between the active surfaces of sensing element 310-1 and sensing element 310-2 (e.g., represented by distance d' in FIG. 5) may be approximately 0.6 millimeters (mm) or less.

As indicated above, FIGS. 7A and 7B are provided merely as examples. Other examples are possible and may differ from what was described with regard to FIGS. 7A and 7B.

In some implementations, as described above, magnet 210 may include a diametrally magnetized magnet or an axially magnetized magnet. FIGS. 8A-8D are diagrams showing example magnetic field strengths associated with use of a diametrally magnetized magnet 210 and an axially magnetized magnet 210 in association with angle sensor 220.

Figure 8A:
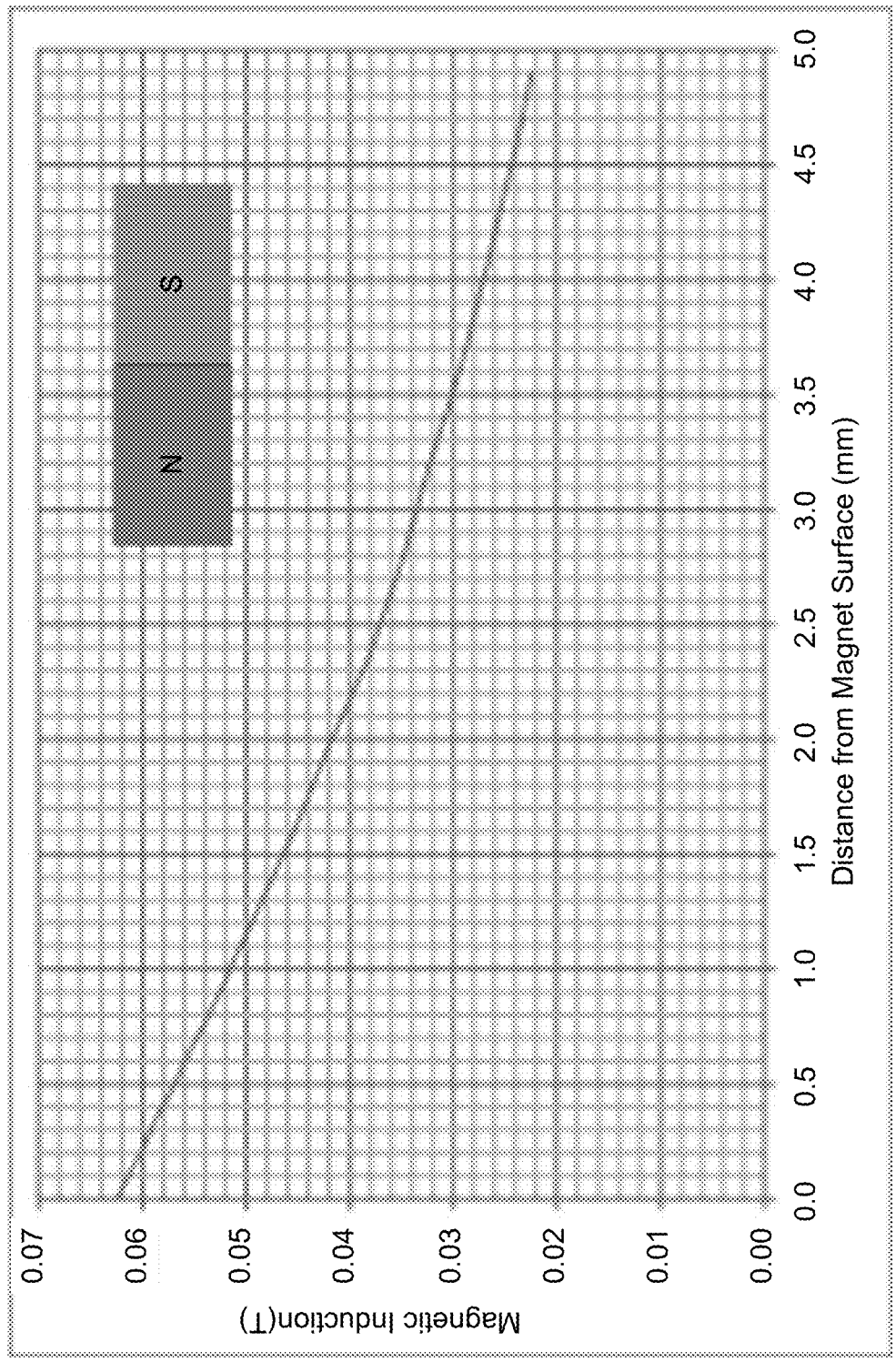
FIGS. 8A-8D are graphical representations showing example magnetic field strengths associated with use of a diametrally magnetized magnet and an axially magnetized magnet in association with the angle sensor of FIG. 2.

FIG. 8A is a diagram of an example graphical representation of magnetic field strength as a function of axial distance from a surface of magnet 210 to sensing element 310 for a diametrally magnetized magnet 210 with a diameter of 10 millimeters (mm) and a thickness of 4 mm. As shown, for an axial distance of 1 mm (e.g., distance d from the surface of magnet 210 to the surface of sensing element 310-1 in FIG. 5) the magnetic field strength is approximately equal to 52 mT. Similarly, for an axial distance of 1.6 mm (e.g., distance d+d' from the surface of magnet 210 to the surface of sensing element 310-2 in FIG. 5), the magnetic field strength is approximately equal to 45 mT. Here, the difference in magnetic field strength at the two different axial distances is approximately equal to 7 mT. Assuming that sensing elements 310-1 and 310-2 have a linear range of approximately ±80 mT and a dR/R of 100% (e.g., in the case of a TMR based stack), a usable signal swing is approximately equal to 6.66% (e.g., (100%/160 mT)×7 mT=4.4%). This signal ratio is approximately equal to or greater than that achieved by a typical (e.g., GMR-based or AMR-based) angle sensor and is, therefore, sufficient for signal evaluation.

Figure 8B:
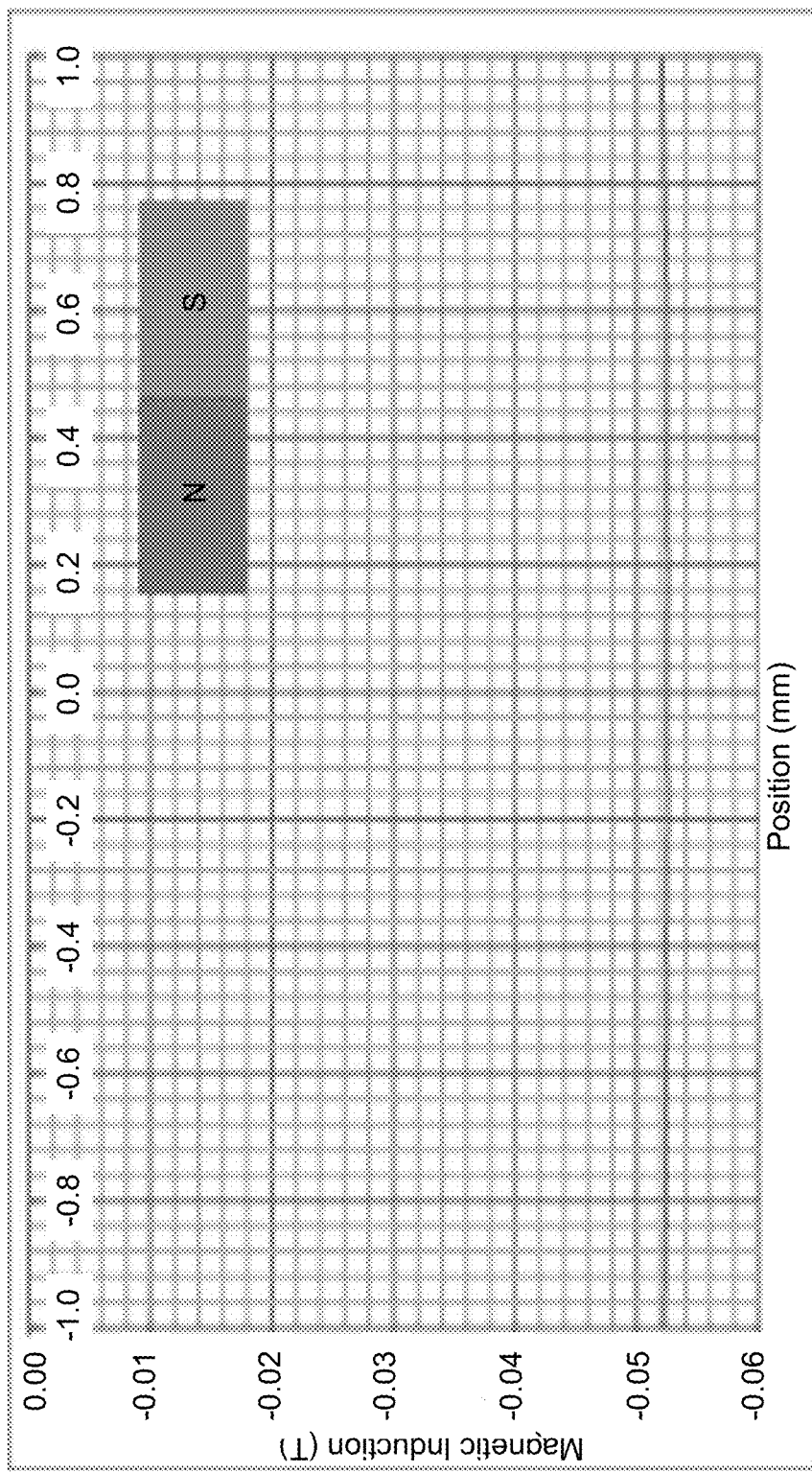

FIG. 8B is a diagram of an example graphical representation of magnetic field strength, at an axial distance of 1 mm from the surface of a diametrally magnet 210, as a function of radial distance (e.g., a distance from the axis of rotation of magnet 210). As shown in FIG. 8B, for the diametrally magnetized magnet 210, the magnetic field strength is substantially constant across a 2 mm range of radial distances. Thus, use of a diametrally magnetized magnet 210 may result in reduced sensitivity to positioning of the axis of rotation of magnet 210 with respect to centers of sensing elements 310.

Figure 8C:
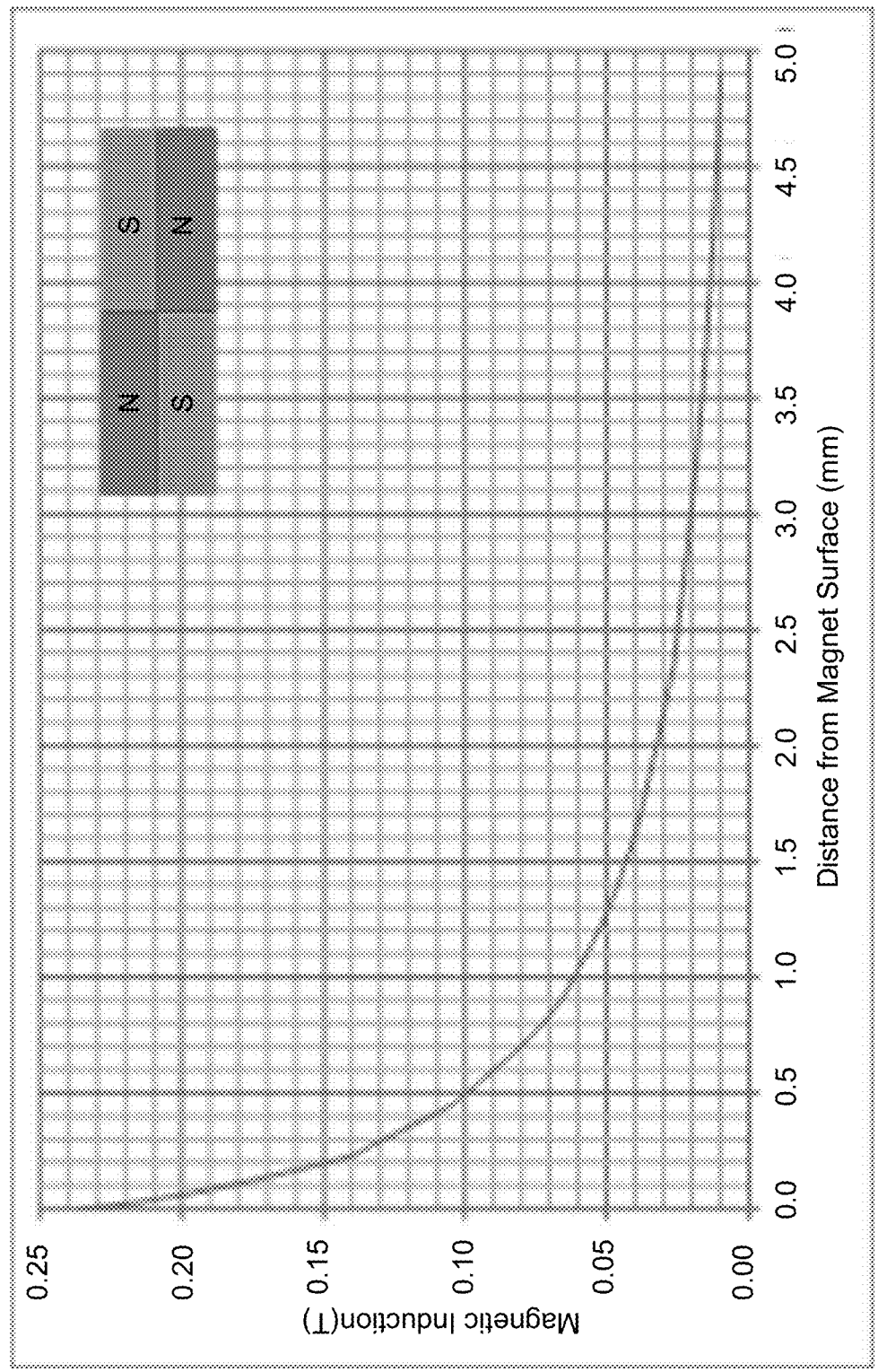

FIG. 8C is a diagram of an example graphical representation of magnetic field strength as a function of axial distance from a surface of magnet 210 to sensing element 310 for an axially magnetized magnet 210 with a diameter of 10 mm and a thickness of 4 mm. As shown, for an axial distance of 1 mm (e.g., distance d from the surface of magnet 210 to the surface of sensing element 310-1 in FIG. 5) the magnetic field strength is approximately equal to 60 mT. Similarly, for an axial distance of 1.6 mm (e.g., distance d+d' from the surface of magnet 210 to the surface of sensing element 310-2 in FIG. 5), the magnetic field strength is approximately equal to 42 mT. Here, the difference in magnetic field strength at the two different axial distances is approximately equal to 18 mT. Assuming that sensing elements 310-1 and 310-2 have a linear range of approximately ±80 mT and a dR/R of 100%, a usable signal swing may be approximately equal to 11.3% (e.g., (100%/160 mT)×18 mT=11.3%). This signal ratio is greater than (by approximately three times) that of achieved by the typical angle sensor and is, therefore, sufficient for signal evaluation.

Figure 8D:
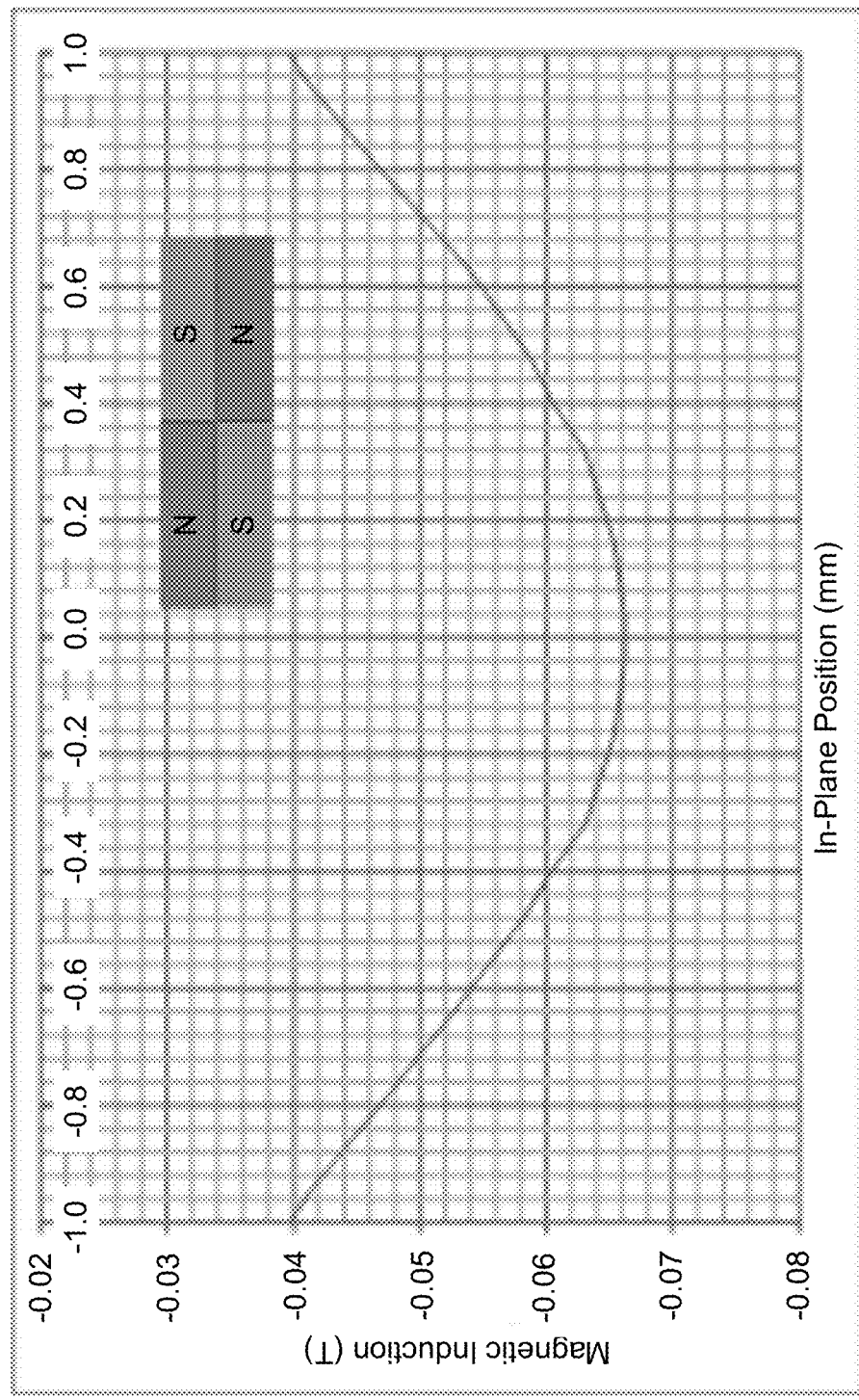

FIG. 8D is a diagram of an example graphical representation of magnetic field strength, at an axial distance of 1 mm from the surface of an axially magnetized magnet 210, as a function of radial distance (e.g., a distance from the axis of rotation of magnet 210). As shown in FIG. 8D, for the axially magnetized magnet 210, the magnetic field strength is varies across a 2 mm range of radial distances. Thus, use of an axially magnetized magnet 210 may require more accurate positioning of magnet 210 (e.g., as compared to use of a diametrally magnetized magnet) in order to achieve high angle accuracy.

However, use of an axially magnetized 210 may allow for a side-by-side arrangement of sensing elements 310 (e.g., rather than a stacked arrangement). For example, FIG. 8D shows that different magnetic field strengths may be achieved at different radial distances for a particular axial distance (e.g., the 1 mm distance associated with FIG. 8D). Thus, the side-by-side arrangement may allow the influence of a disturbance magnetic field to be suppressed in a manner similar to that described above. Here, using the above described example capabilities, sensing elements 310 may be spaced apart by approximately 0.6 mm (e.g., in order to achieve the same usable signal swing as described above). In such a case, a chip of angle sensor 220 may need to be at least approximately 1.2 mm×1.2 mm in size.

As indicated above, FIGS. 8A-8D are provided merely as examples. Other examples are possible and may differ from what was described with regard to FIGS. 8A-8D.

Figure 9:
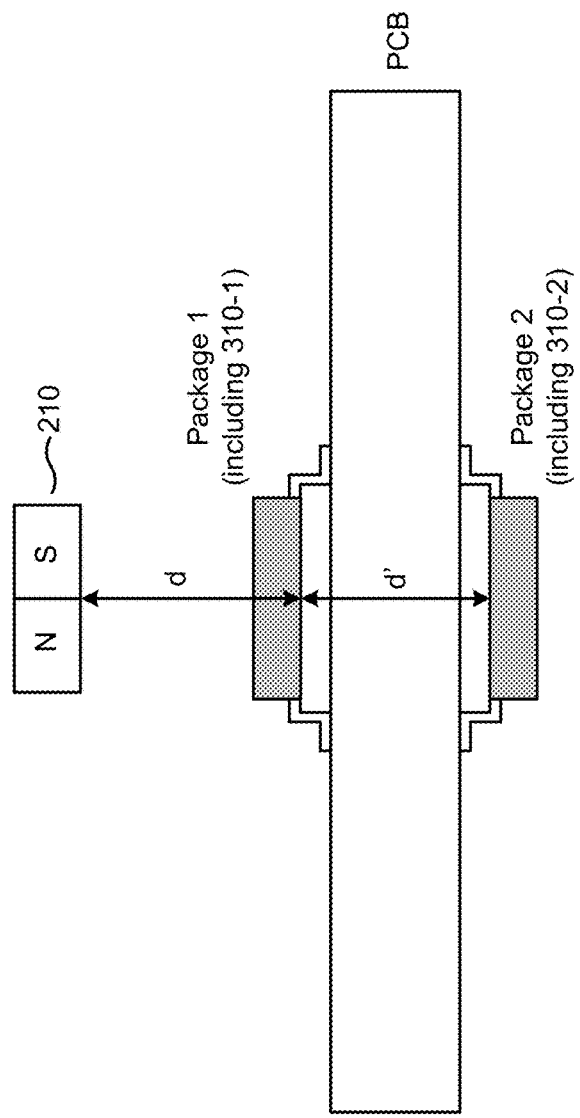
FIG. 9 is a diagram an example implementation of multiple angle sensors arranged to suppress an effect of a disturbance magnetic field.

In some implementations, as described above, sensing elements 310-1 and 310-2 may be stacked in a single sensor package in order to allow the influence of a disturbance magnetic field to be suppressed. Alternatively, sensing elements 310-1 and 310-2 may be stacked in different packages in order to allow the influence of a disturbance magnetic field to be suppressed. FIG. 9 is an example implementation 900 of multiple sensor packages stacked to permit suppression of an effect of a disturbance magnetic field. As shown in FIG. 9, a first sensor package (e.g., package 1 including sensing element 310-1) may be arranged on first side of a printed circuit board (PCB), and a second sensor package (e.g., package 2 including sensing element 310-2) may be arranged on a second side of the PCB. As shown, sensing element 310-1 may be arranged at distance d from a surface of magnet 210, and sensing element 310-2 may be arranged at distance d+d'. Such an arrangement may allow for a larger distance d' (e.g., as compared to a stacked arrangement in a single package) and, therefore, permits an increased usable signal swing due to a higher difference in magnetic field strength at distances d and d+d'.

As indicated above, FIG. 9 is provided merely as an example. Other examples are possible and may differ from what was described with regard to FIG. 9.

Implementations described herein provide an angle sensor, including at least two sensing elements, that is capable of suppressing an influence of a disturbance magnetic field on an angular measurement associated with a rotating magnetic field (e.g., produced by a rotatable magnet). In some implementations, the at least two sensing elements are capable of measuring strengths of corresponding in-plane components of a magnetic field (i.e., the sets of sensing elements may operate in a non-saturated mode) in order to permit suppression of the influence of the disturbance magnetic field.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the terms apparatus and element are intended to be broadly construed as hardware, firmware, and/or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An angle sensor, comprising:
    a first sensing element to provide a first set of output signals associated with a magnetic field produced by a rotatable magnet,
        wherein the first set of output signals comprise a first output signal and a second output signal,
        wherein the first sensing element is arranged at a first distance from a surface of the rotatable magnet along a given direction, and
        wherein the first sensing element is configured to operate in a non-saturated mode;
    a second sensing element to provide a second set of output signals associated with the magnetic field produced by the rotatable magnet,
        wherein the second set of output signals comprise a third output signal and a fourth output signal,
        wherein the second sensing element is arranged at a second distance from the surface of the rotatable magnet along the given direction, and
        wherein the second sensing element is configured to operate in a non-saturated mode; and
    a processor to:
        determine a first difference between the first output signal and the third output signal;
        determine a second difference between the second output signal and the fourth output signal; and
        determine, based on the first difference and the second difference, an angle of rotation of the rotatable magnet.

2. The angle sensor of claim 1, wherein an influence of a disturbance magnetic field is suppressed from the determined angle of rotation as a result of determining the angle of rotation.

3. The angle sensor of claim 1, wherein an active surface of the first sensing element and an active surface of the second sensing element are centered substantially on an axis of rotation of the rotatable magnet.

4. The angle sensor of claim 1, wherein the first sensing element and the second sensing element are arranged in a stacked arrangement.

5. The angle sensor of claim 1, wherein the first sensing element and the second sensing element are arranged in a single package.

6. The angle sensor of claim 1, wherein a distance between the first sensing element and the second sensing element is less than or equal to approximately 0.6 millimeters.

7. The angle sensor of claim 1, wherein a distance from the surface of the rotatable magnet to the first sensing element is in a range from 0.6 millimeters to 10.0 millimeters.

8. The angle sensor of claim 1, wherein the first sensing element or the second sensing element includes a pair of full bridges or a pair of half bridges.

9. The angle sensor of claim 1, wherein the first set of output signals includes at least a first sine signal and a first cosine signal, and
    wherein the second set of output signals includes at least a second sine signal and a second cosine signal.

10. The angle sensor of claim 1, wherein the first set of output signals includes at least a first inverted sine signal and a first inverted cosine signal, and wherein the second set of output signals includes at least a second inverted sine signal and a second inverted cosine signal.

11. The angle sensor of claim 1, wherein the first difference is a difference in amplitude between the first output signal and the third output signal, and wherein the second difference is a difference in amplitude of the second output signal and the fourth output signal.

12. The angle sensor of claim 1, wherein the first output signal is a first sine signal, wherein the second output signal is a first cosine signal, wherein the third output signal is a second sine signal, and wherein the fourth output signal is a second cosine signal.

13. An apparatus, comprising:

a first sensing element, arranged at a first distance from a magnet, to provide a first set of output signals associated with a magnetic field produced by the magnet, wherein the first set of output signals comprise a first output signal and a second output signal, and wherein amplitudes of the first set of output signals are dependent on a strength of the magnetic field at the first sensing element;

a second sensing element, arranged at a second distance from the magnet, to provide a second set of output signals associated with the magnetic field produced by the magnet, wherein the second set of output signals comprise a third output signal and a fourth output signal, and wherein amplitudes of the second set of output signals are dependent on a strength of the magnetic field at the second sensing element; and a processor to:

determine a first difference between the first output signal and the third output signal;

determine a second difference between the second output signal and the fourth output signal; and determine, based on the first difference and the second difference, an angle of rotation of the magnet.

14. The apparatus of claim 13, wherein an influence of a disturbance magnetic field is suppressed from the determined angle of rotation as a result of determining the angle of rotation.

15. The apparatus of claim 13, wherein the first sensing element and the second sensing element are centered substantially on an axis of rotation of the magnet and are arranged in a stacked arrangement.

16. The apparatus of claim 13, wherein the first sensing element and the second sensing element are arranged in a single package.

17. The apparatus of claim 13, wherein the first set of output signals includes at least one of:

a first sine signal and a first cosine signal, or a first inverted sine signal and a first inverted cosine signal, and wherein the second set of output signals includes at least one of:

a second sine signal and a second cosine signal, or a second inverted sine signal and a second inverted cosine signal.

18. The apparatus of claim 13, wherein the first output signal is a first sine signal, wherein the second output signal is a second sine signal, wherein the third output signal is a third sine signal, and wherein the fourth output signal is a fourth sine signal.

19. The apparatus of claim 13, wherein the first output signal is a first cosine signal, wherein the second output signal is a second cosine signal, wherein the third output signal is a third cosine signal, and wherein the fourth output signal is a fourth cosine signal.

20. A magnetic sensor, comprising:

a first sensing element to provide a first set of output signals associated with a magnetic field produced by a magnet, wherein the first set of output signals comprise a first output signal and a second output signal, wherein the first sensing element is arranged at a first distance from the magnet, and wherein the first sensing element operates in a non-saturated mode such that amplitudes of the first set of output signals depends on a strength of the magnetic field at the first sensing element;

a second sensing element to provide a second set of output signals associated with the magnetic field produced by the magnet, wherein the second set of output signals comprise a third output signal and a fourth output signal, wherein the second sensing element is arranged at a second distance from the magnet, and wherein the second sensing element operates in a non-saturated mode such that amplitudes of the second set of output signals depends on a strength of the magnetic field at the second sensing element; and a processor to:

determine a first difference between the first output signal and the third output signal;

determine a second difference between the second output signal and the fourth output signal; and determine, based on the first difference and the second difference, an angle of rotation of the magnet.

* * * * *